(12) United States Patent
Bradley

(10) Patent No.: US 7,304,469 B1
(45) Date of Patent: Dec. 4, 2007

(54) ADAPTIVE METHOD USED TO OVERCOME CHANNEL TO CHANNEL ISOLATION

(75) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 11/438,000

(22) Filed: May 18, 2006

(51) Int. Cl.
*G01R 23/16* (2006.01)

(52) U.S. Cl. .................................. 324/76.22; 324/615

(58) Field of Classification Search ................. 324/641, 324/601, 76.22, 615
See application file for complete search history.

(56) References Cited

U.S. PATENT DOCUMENTS 6,766,262 B2 * 7/2004 Martens ....................... 702/69

* cited by examiner

*Primary Examiner*—Walter Benson
(74) *Attorney, Agent, or Firm*—Fliesler Meyer LLP

(57) ABSTRACT

Selectable attenuators are used in the reference and test paths of a VNA, with attenuation automatically inserted or deleted when the Device Under Test (DUT) attenuation reaches predetermined thresholds. Attenuation in the reference channel is removed when the signal in the test channel is sufficient to overcome the leakage of the reference channel. Additionally, attenuation is removed from the test channel when the reference channel has a high attenuation inserted to further increase the difference between the leakage reference signal and the reduced test channel signal thus allowing lower isolation requirements on the two (or more) receiving channels.

22 Claims, 10 Drawing Sheets

304: Fig. 3 Rns+Tns
604: Fig. 6 Rns+Tns
804: Fig. 8 Rns+Tns
1004: Fig. 10 Rns+Tns
1204: Fig. 12 Rns+Tns
1404: Fig. 14 Rns+Tns
1604: Fig. 16 Rns+Tns

ADAPTIVE METHOD USED TO OVERCOME CHANNEL TO CHANNEL ISOLATION

BACKGROUND

1. Technical Field

The present invention relates to providing attenuation in a Vector Network Analyzer (VNA) receiver to prevent non-linear receiver signal output when measuring insertion loss or gain of a device under test (DUT).

2. Related Art

Currently available two port VNAs attenuate the reference channel as much as practical to overcome the leakage signal from the reference channel to the test channel. The resulting constructive and destructive addition of the desired measurement signal through the DUT causes a ripple signal to appear. A limitation is reached when the reference signal is decreased enough to cause noticeable noise when measuring low insertion loss devices due to the excess noise in the reference channel itself. This forces the two (or more) measurement channels of the VNA to be designed with inherently high isolation at a considerable cost.

Due to these high noise isolation requirements, the design of a combined source and detector, such as a VNA, used to measure the insertion loss or gain of a DUT will typically be bounded by a number of constraints discussed to follow.

As a first constraint, the maximum input to the receiver is limited by the point at which the receiver starts to exhibit nonlinearity. For a microwave sampler this level is about −21 dBm. For mixers, depending on the LO drive level, nonlinearity can be exhibited at 0 dBm.

As another constraint, the minimum input to the receiver is first limited by KTB Noise. The KTB noise is fixed at −174 dBm in a 1 Hz Bandwidth receiver at 25 Degrees Celsius. This noise increases by a factor of 10 Log(Bandwidth) in Hz. The minimum input to the receiver is also limited by the Noise Figure (NF) of the receive chain. Sampler based systems have a NF of around 30 dB. Mixer based systems have a NF of around 10 dB. The relative merits of mixer vs. sampler based systems is primarily due to complexity of the mixer, although LO frequency generation is also more complex in mixers. Wide bandwidth mixers are constrained by the internal Balun structures, which limit the mixer operation to 100s of KHz to 100s of MHz, or 100s of MHz to 20 to 40 GHz.

Isolation is another constraint on receivers. Isolation between mixers is dependent on their inherent RF to LO isolation plus the isolation between the two (or more) LO drive circuits. Isolation between the two LO drive circuits is usually determined by a splitter. The splitter is also constrained by its internal Balun structure. The splitter is limited to the same frequency ranges as the mixers. Samplers on the other hand are simple devices in comparison. The LO (Sampler turn on drive) is a narrow pulse on the order of 10s of picoseconds. The isolation between samplers is accomplished with simple orthogonal microstrip to coplanar waveguide transitions. The LO pulse frequency only has to cover one octave, starting at the lowest frequency of operation. Higher frequencies are converted using under sampling. For convenience, further description will be limited to sampler based systems, although techniques according to embodiments of the present invention are understood to work equally well with mixer based systems. A typical planar dual sampler driven with a common pulse will exhibit about 50 dB of isolation between sampler inputs. Laboratory grade samplers can reach 85 dB. These devices rely on very complex splitters. They are physically large due to the 3D construction of the pulse coupling through the orthogonal plane. Further examples herein are limited to splitters with a limit of 50 dB of isolation. These constraints define the upper and lower limits of a receiver.

To measure loss and gain using a source/receiver of a conventional VNA, attenuation is typically provided to the reference channel enough to keep the leakage signal >10 dB below the KTB Noise Floor of the Test Channel. The drawback to this technique is that the KTB noise of the reference channel dominates in low loss measurements.

FIG. 1 shows components of a VNA connected to measure a DUT to provide a reference to describe how noise is limited. In FIG. 1, the gain or attenuation of each component is labeled. The labels are used to analyze the Reference (R) signal component and the Transmitted (T) signal component as measured by the VNA.

The components illustrated in FIG. 1 for a VNA are conventional and include the signal source 2 for providing a test signal to coupler 4. The test signal is provided on a through path of the coupler 4 and experiences an incident signal loss (IL) before being provided through a device under test (DUT) 8. The test signal from the DUT 8 is then received through attenuator (A2) 10 and provided for down conversion in downconverter 14. The downconverter 14 generates harmonics, creating the NFT, or noise figure component for the test signal. The bandpass filter 18 passes the desired harmonic of the test signal (T) to the VNA receiver for evaluation. The receiver noise of the test system 22 is illustrated to be added in at summer 24.

The signal from source 2 is also provided through the coupling path of coupler 4 as a reference signal, and experiences a coupling loss (CPL) before reaching the attenuator (A1) 6. The reference signal from the attenuator is provided to downconverter 12. The downconverter 12 generates harmonics, creating the NFR, or noise figure component for the reference signal. The bandpass filter 16 passes the desired harmonic of the reference signal (R) to the VNA receiver for evaluation. The receiver noise of the test system 20 is illustrated to be added in at summer 26.

A synopsis of each component and its attenuation contribution is labeled as follows:

PIN: VNA Signal Source (2)
IL: Insertion Loss of Through Path of Coupler (4)
CPL: Loss through Coupling Path of Coupler (4)
A1: Attenuation through attenuator A1 (6)
DUT: Attenuation through DUT (8)
A2: Attenuation through attenuator A2 (10)
NFR: Noise Figure of reference downconverter (12)
NFT: Noise Figure of transmitted downconverter (14)
ISO: Isolation Attenuation (15) between downconverters (12) and (14)
BWR: Bandwidth of the Reference Filter (16) in KHz
BWT: Bandwidth of Transmitted Filter (18) in KHz
NSR: Noise source contribution of reference receiver (20)
NST: Noise source contribution of transmitted receiver (22)

A number of equations identified below are used in conventional systems to determine the values of A1 and A2, as well as noise in the reference (R) and test (T) signals. The values for A1 and A2 in the equations are determined assuming NFR=29 dB, and BWR=23 KHz. The equations to determine A1 and A2 are as follows:

$$R = PIN - CPL - A1$$

$$NSR = 10 * \text{Log } BWR + NFR - 174$$

NSR=101.4 dBm (For NSR=29 dB and BWR= 23 KHz)

R/NSR=R-NSR

T=PIN-IL-DUT-A2

NST=10*Log BWT+NFT-174

NST=101.4 dBm (For NFT=29 dB and BWT= 23 KHz)

T/NST=T-NST

R=R-ISO

T/RI=T-RI=T-R+ISO

Let T/R1=T/NST+Delta (T/R1>T/NST by Delta dB)

T=R+ISO=T-NST+Delta

T-(PIN-CPL-A1)+ISO=T-NST+Delta

NST-Delta=PIN-CPL-A1-ISO

A1=PIN-CPL-NST-ISO+Delta     (Equation 1 for A1)

T=PIN-IL-DUT-A2

A2=PIN-IL-DUT-T     (Equation 1 for A2)

Next, to provide values for A1 and A2 in a typical system, as an example it is assumed that T=−21 dbM at DUT=0 dB. Also, PIN is +9 dB, IL is −4 dB, CPL is −14 dB, ISO is −50 dB and Delta is 15 dB. Applying these values, the following values for A1 and A2 are determined from Equation 1 for A1 and Equation 1 for A2 as follows:

A2=PIN-IL+21     (From Equation 1 for A2)

A2=9-4+21

A2=26 dB

A1=PIN-CPL-NST-ISO+Delta     (From Equation 1 for A1)

A1=9-14-(-101.4)-50+15

A1+61.4 dB

Next formulas for the signal to noise ratio are determined for both the reference signal (R) relative to NSR and the test signal (T) relative to NST, and the test signal (T) relative to R1. The formulas are derived as follows:

T/NST=T-NST

T/NST=PIN-IL-DUT-A2-NST

T/NST=+9-4-DUT-26-(101.4)

T/NST=80.4-DUT

T/R1=T-R+ISO

T/R1=PIN-IL-DUT-A2-R-ISO

T/R1=PIN-IL-DUT-A2-(PIN-CPL-A1)+ISO

T/R1=PIN-IL-DUT-A2-PIN+CPL+A1+ISO

T/R1=CPL+ISO+A1-IL-A2-DUT

T/R1=95.4-DUT

R/NSR=R-NSR

R/NSR=PIN-CPL-A1-NSR

R/NSR=+9-14-61.4-(101.4)

R/NSR=35.5 dB

For a given signal to noise ratio in dB (SN), the converted Noise Signal (NS) in dB is:

NSdB=20*((Log(1+10$^{-(SN/20)}$)-Log(1-10$^{-(SN/20)}$))

For a given signal to interfering signal ratio (SIS) in dB, the converted Ripple (RIP) in dB is:

RIPdB=20*(Log(1+10$^{-(SIS/20)}$)-Log(1-10$^{-(SIS/20)}$))

For two uncorrelated S/N Noise Sources VN1 and VN2 in dB, the total Noise VNT in dB is:

VN1=10$^{(SN1/20)}$

VN2=10$^{(SN2/20)}$

VNT=SQR((VN$^2$)+(VN2)$^2$))

NSTdB=20*((Log(1+VNT)-Log(1-VNT))

FIG. 2 shows a plot of S/N ratio in dB for three different measured signals versus DUT loss in dB. First, a plot 200 of the reference channel signal to noise ratio R/NSR is provided vs. DUT loss. Second, a plot 202 of the test channel signal to noise ratio T/NST is provided vs. DUT loss. Third a plot 204 of the test channel signal to interfering signal T/R1 is provided vs. DUT loss.

FIG. 3 shows a plot of converted noise signals and ripple versus DUT loss in dB. First, a plot 302 of the converted reference channel S/N Rns is provided vs. DUT loss. Second, a plot 300 of the converted test channel S/N ratio Tns is provided vs. DUT loss. Third, a plot 304 of the total converted noise Tns+Rns is provided. Fourth, a plot of the ripple 306 is provided.

As seen from FIG. 3, the ripple stays 15 dB (Delta) below the test channel noise, thus making it transparent. It is also apparent that the total noise due to Rns is dominant for DUT=<45.4 dB. This is the unfortunate consequence of A1 being dependant on isolation to get the ripple below the noise.

SUMMARY

According to embodiments of the present invention, selectable attenuators are used in the reference and test paths of a combined source and detector device, such as a VNA, with attenuation automatically inserted or deleted when the DUT attenuation reaches predetermined thresholds.

Attenuation in the reference channel is removed or deleted when the signal in the test channel is sufficient to overcome the leakage of the reference channel. Additionally, attenuation is removed from the test channel when the reference channel has the high attenuation inserted to further increase the difference between the leakage reference signal and the reduced test channel signal thus allowing lower isolation requirements on the two (or more) receiving channels. The embodiments of the present invention can be either mixer or sampler based in construction.

BRIEF DESCRIPTION OF THE DRAWINGS

Further details of the present invention are explained with the help of the attached drawings in which.

DETAILED DESCRIPTION

Figure 4:
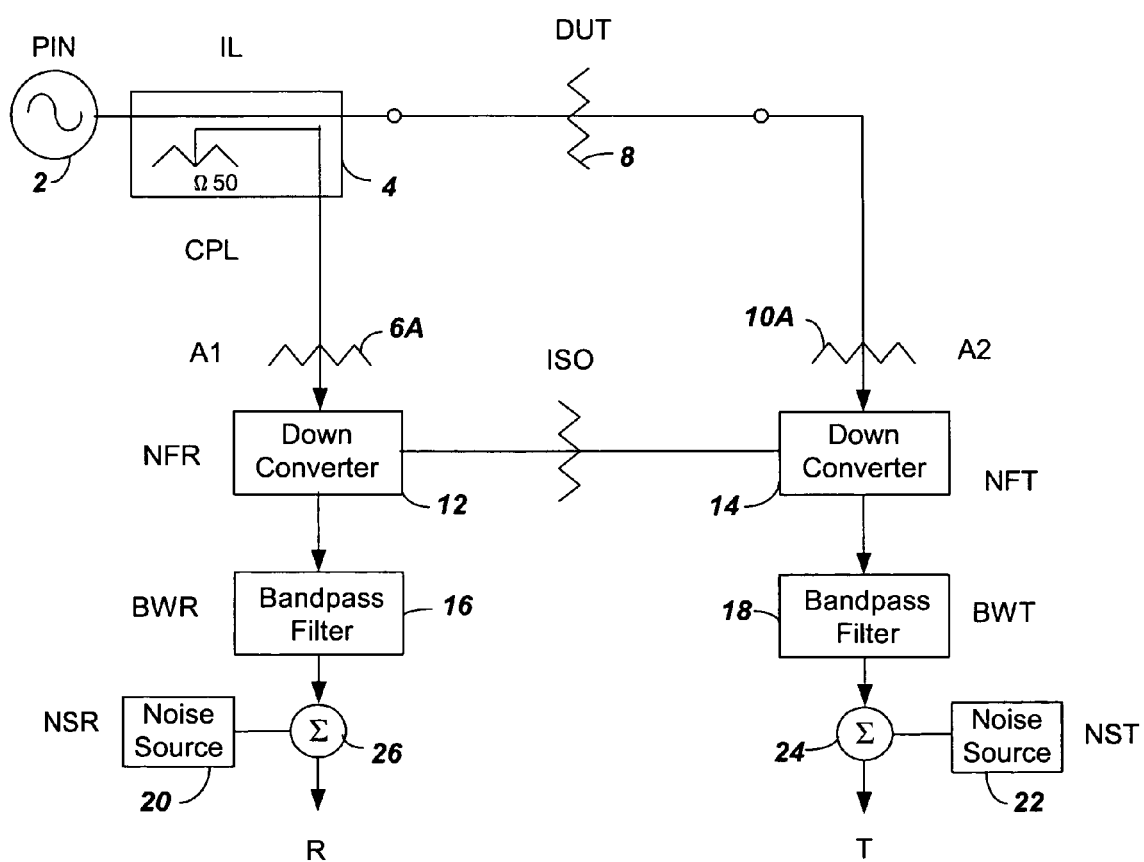
FIG. 4 shows components of a VNA according to embodiments of the present invention using variable attenuation values for A1 and A2.

FIG. 4 illustrates embodiments of the present invention, wherein variable attenuators 6A and 10A are provided to make the attenuation values A1 and A2 variable. Variation of the attenuation values A1 and A2 enables isolation noise between the reference and transmit receivers to be reduced so that less complex equipment is required in a VNA.

1. First Embodiment

In a first embodiment of the present invention, A1 is changed to allow T/R1=R/NSR+Delta instead of T/R1+T/NST+Delta. One advantage that this provides is to allow the noise due to Rns to be at a minimum for DUT=<45.4 dB and dominated by Tns>45.4 dB. The equations for A1 and A2 are rederived as follows:

T/R1=R/NSR+Delta

T−R1=R−NSR+Delta

R1=R−ISO

T−R+ISO=R−NSR+Delta

T+ISO=2*R−NSR+Delta

2*R=T+ISO−NSR−Delta

R=(T+ISO+NSR−Delta)/2

R=PIN−CPL−A1 (Determined From FIG. 4)

PIN−CPL−A1=(T+ISO+NSR−Delta)/2 (By setting R=R in last 2 equations)

A1=PIN−CPL−(T+ISO+NSR−Delta)/2

A1=PIN−CPL−PIN/2+(IL+DUT+A2+Delta−ISO−NSR)/2

A1=PIN/2−CPL+(IL+DUT+A2+Delta−ISO−NSR)/2   (Equation 2 for A1)

Applying the values from the previous, non-limiting example of NFR=NFT=29 dB, BWR=BWT=23 KHZ, NSR=101.4 dBm, PIN=9 dBm, IL=4 dB, CPL=14 dB, ISO=50 dB and Delta=+15 dB we determine A1 as follows:

A1=PIN/2−CPL+(IL+DUT+A2+Delta−ISO−NSR)/2   (From Equation 2 for A1)

A1=+9/2−1 4+(+4+DUT+26+15+50−(−101.4)/2

A1=DUT/2+38.7

This equation shows that A1 is now dependant on DUT. A1 can now be realized by a variable attenuator that can track the value of DUT by the above relationship of DUT/2+38.7. The value for A2 remains fixed at 26 dB, as determined previously using Equation 1 for A2.

Figure 5:
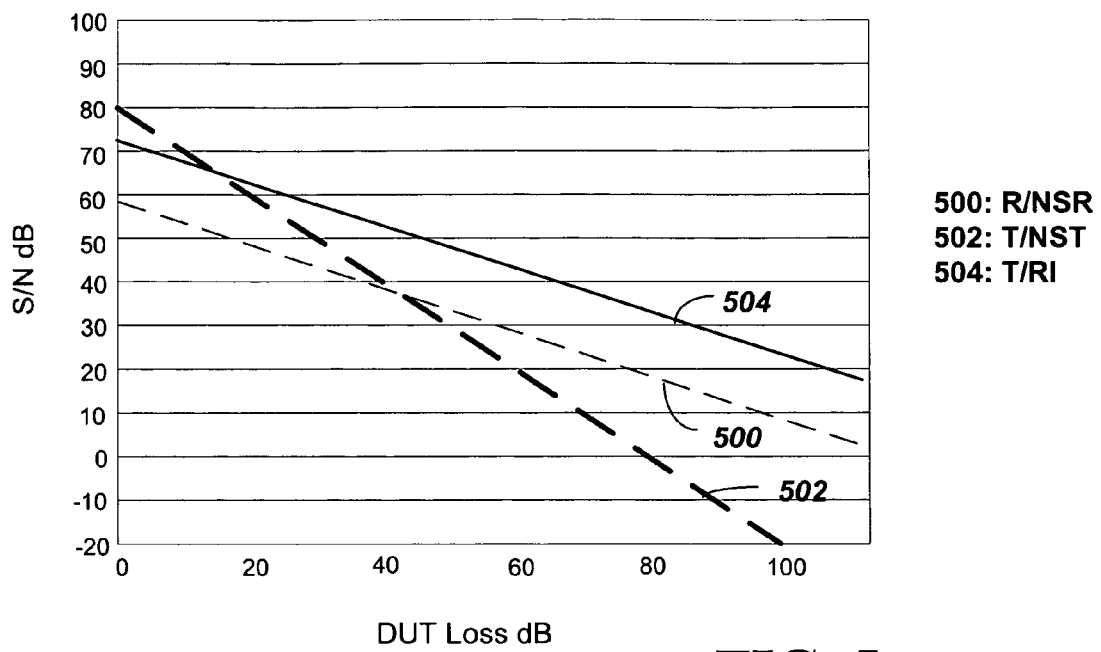
FIG. 5 shows plots of noise signal ratios vs. DUT attenuation, with a variable receive channel attenuation A1, wherein A1=DUT/2+38.7, the noise signals ratios including: (a) R/NST, (b) T/NST, and (c) T/RI.

FIG. 5 shows a plot of S/N ratio in dB for three different signals for three different measured signals versus DUT loss in dB with A2 being a variable attenuator that tracks the DUT value. First, a plot 500 of the reference channel signal to noise ratio R/NSR is provided vs. DUT loss. Second, a plot 502 of the test channel signal to noise ratio T/NST is provided vs. DUT loss. Third a plot 504 of the test channel signal to interfering signal T/R1 is provided vs. DUT loss.

Figure 6:
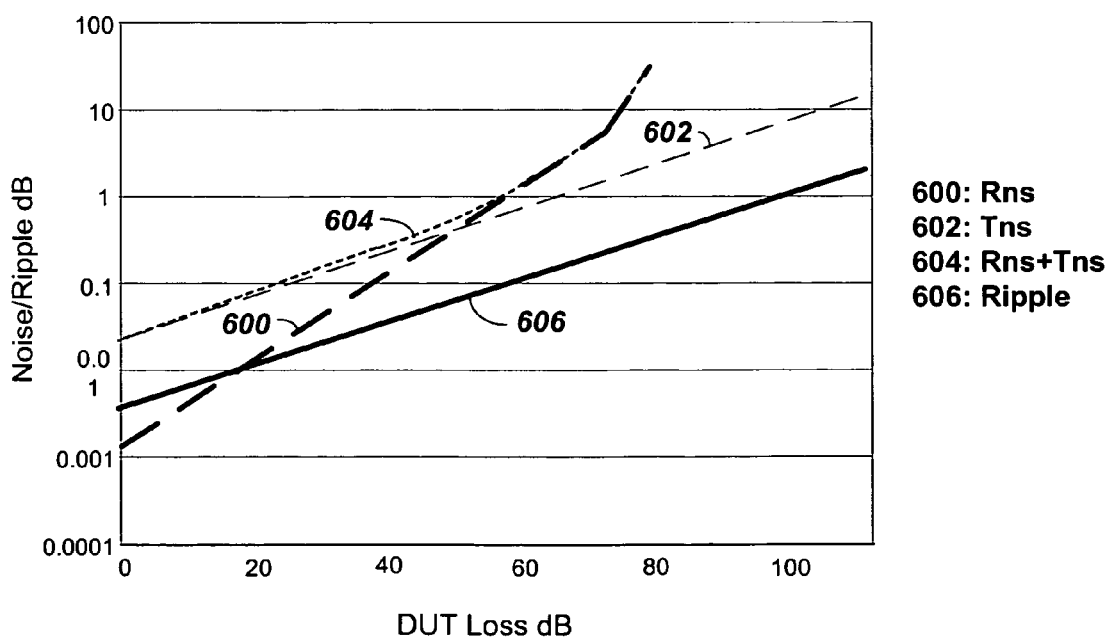
FIG. 6 shows plots of converted noise vs. DUT attenuation, with the variable attenuation A1=DUT/2+38.7, the converted noise including: (a) Rns, (b) Tns, (c) Rns+Tns, and (d) the ripple.

FIG. 6 shows a plot of converted noise signals and ripple versus DUT loss in dB with the variable A1 attenuator that tracks the DUT loss. First, a plot 600 of the converted reference channel S/N Rns is provided vs. DUT loss. Second, a plot 602 of the converted test channel S/N ratio Tns is provided vs. DUT loss. Third, a plot 604 of the total converted noise Tns+Rns is provided. Fourth, a plot of the ripple 606 is provided due to the finite isolation of 50 dB between the R and T samplers.

The conditions of FIG. 6 are substantially the same as the example of FIG. 4, with the exception of A1 changing from a fixed 61.4 dB to a value based on DUT/2+38.7. The results of FIG. 6 show that the ripple now stays a constant value (Delta) below the reference channel noise, thus, making it transparent. The noise due to Rns is still dominant for DUT=<45.4 dB. This is the minimum noise that can be achieved for Rns while still remaining Delta dB. A further reduction of Rns will cause the decrease of Delta, which in turn will increase ripple.

2. Second Embodiment

In a second embodiment of the present invention, a slight reduction in total noise can be realized if conditions are reverted back to T/R1=T/NST+Delta for DUT>45.4 dB. The noise reduction occurs where Tns=Rns at DUT=45.4 dB.

Figure 7:
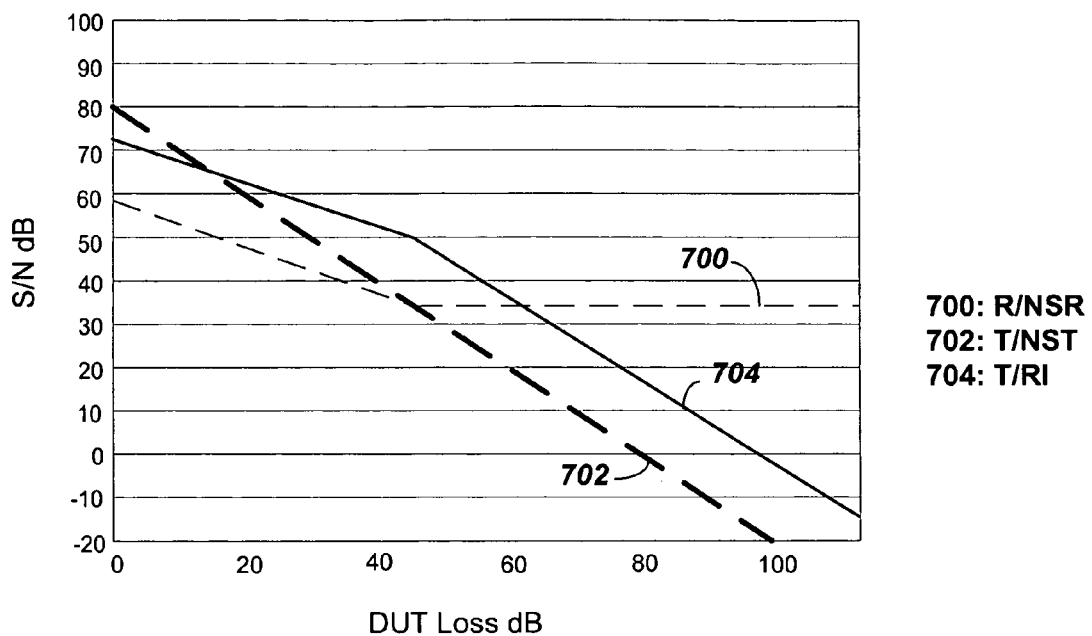
FIG. 7 shows plots of noise signal ratios vs. DUT attenuation as in FIG. 5, with a variable receive channel attenuation A1 as in FIG. 5 only up to DUT=45 dB, and A1 remaining constant at 61.4 dB as in FIG. 2 with DUT>45 dB.

FIG. 7 shows a plot of S/N ratio in dB for three different signals for three different measured signals versus DUT loss in dB with A1 being a variable attenuator that tracks the DUT value only up until DUT=45.4 dB. First, a plot 700 of the reference channel signal to noise ratio R/NSR is provided vs. DUT loss. Second, a plot 702 of the test channel signal to noise ratio T/NST is provided vs. DUT loss. Third a plot 704 of the test channel signal to interfering signal T/RI is provided vs. DUT loss.

Figure 8:
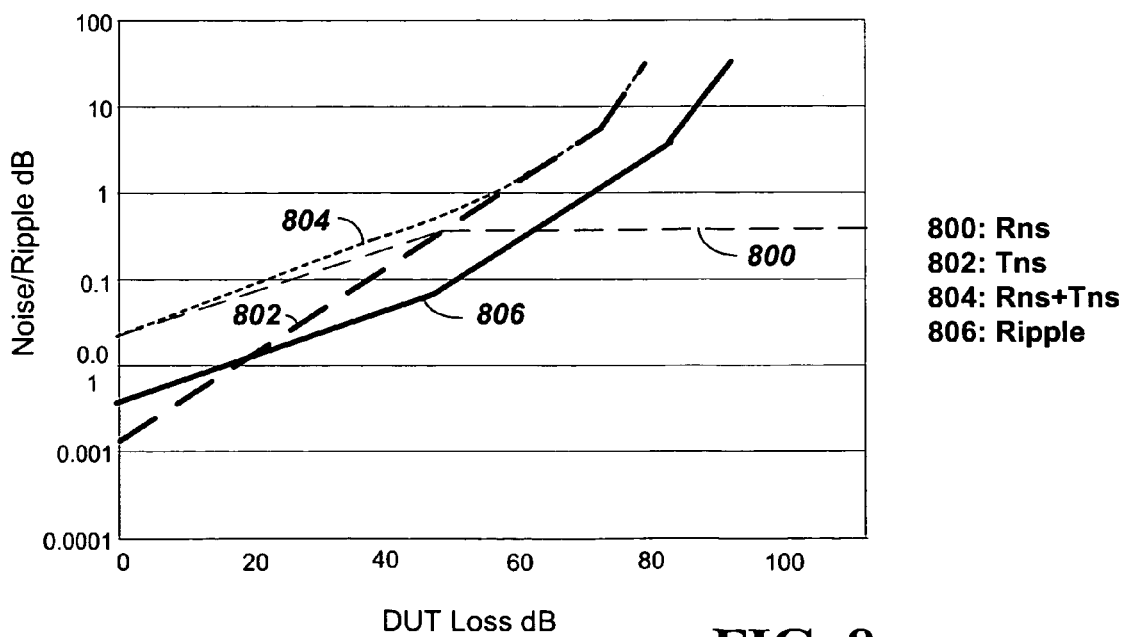
FIG. 8 shows plots of converted noise vs. DUT attenuation with the variable attenuation A1 only up to DUT=45 dB, and A1 remaining constant at 61.4 dB as in with DUT>45 dB as in FIG. 7.

FIG. 8 shows a plot of converted noise signals and ripple versus DUT loss in dB with the variable A1 attenuator that tracks the DUT loss. First, a plot 800 of the converted reference channel S/N Rns is provided vs. DUT loss. Second, a plot 802 of the converted test channel S/N ratio Tns is provided vs. DUT loss. Third, a plot 804 of the total converted noise Tns+Rns is provided. Fourth, a plot of the ripple 806 is provided due to the finite isolation of 50 dB between the R and T samplers.

In FIG. 8, the conditions are changed only slightly from the conditions of FIG. 6. The exception is A1 being a fixed value of 61.4 dB with DUT>45.4 dB, and then A1 taking a value of DUT/2+38.7 for DUT>45.4 dB. There are no discontinuities at the crossover point because DUT/2+38.7=61.4 dB at DUT=45.4. With the configuration used for FIG. 8, ripple now stays a constant value (Delta) below the reference channel noise for DUT=<45.4 dB and then stays a constant value (Delta) below the test channel noise for DUT>45.4 dB.

3. Third Embodiment

For a further embodiment of the present invention, the value of A2 is altered to create a greater dynamic range for the VNA. The value of A2 in previous embodiments described has been fixed due to the fact that a given maximum input to the test channel down converter of −21 dBm and given that T=PIN−IL−DUT−A2 forces A2 to be PIN−IL−DUT+21. For the minimum value of DUT of 0, this forces A2 to be +9−4−0+21=26 dB. If A2 is allowed to go from 26 dB to 0 dB when the DUT goes from 0 dB to 26 dB, then the maximum input of the test channel would satisfy the maximum input of −21 dBm. This provides the benefit of an increase of 26 dB of dynamic range. With A2 modified as described, the equations for A1 and A2 are changed as follows:

$A2 = PIN - IL - DUT - T$   (From Equation 1 for A2)

$A2 = PIN - IL - DUT + 21$ (With T=−21 dBm under the new conditions)

$A1 = PIN/2 - CPL + (IL + DUT + A2 + Delta - ISO - NSR)/2$   (From Equation 2 for A1)

$A1 = PIN/2 - CPL + (IL + DUT + (PIN - IL - DUT + 21) + Delta - ISO - NSR)/2$ (by substituting A2)

$A1 = PIN/2 - CPL + (PIN + 21 + Delta - ISO - NSR)/2$   (Equation 3 for A1)

$A1 = PIN - CPL + (21 + Delta - ISO - NSR)/2$   (Equation 3 for A1 simplified)

Applying the values from the previous, non-limiting example of NFR=NFT=29 dB, BWR=BWT=23 KHZ, NSR=101.4 dBm, PIN=9 dBm, IL=4 dB, CPL=14 dB, ISO=50 dB and Delta=+15 dB we determine A1 and A2 as follows:

$A1 = PIN - CPL + (21 + Delta - ISO - NSR)/2$   (from Equation 3 for A1)

$A1 = +9 - 14 + (21 + 15 + 50 - (-101.4))/2$ (With values for DUT=<26 for this embodiment)

$A1 = 38.7$ dB (for DUT=<26)

$A2 = PIN - IL - DUT + 21$   (From Equation 1 for A2 with T=21 dB)

$A2 = 94 - DUT + 21$ (With values for DUT=<26 for this embodiment)

$A2 = 26 - DUT$ (for DUT=<26)

$A2 = PIN - IL - DUT + 21$   (From Equation 1 for A2 with T=21 dB)

$A2 = +9 - 4 - 26 + 21$ (With values for DUT>26 for this embodiment)

$A2 = 0$ (for DUT>26)

$A1 = PIN/2 - CPL + (IL + DUT + A2 + Delta - ISO - NSR)/2$   (From Equation 3 for A1)

$A1 = +9/2 - 14 + (4 + DUT + 0 + 15 - 50 - (-101.4))/2$ (With values for DUT>26)

$A1 = 9.5 + DUT/2 + 70.4/2$ $A1 = DUT/2 + 25.7$ (for DUT>26 for this third embodiment)

Figure 9:
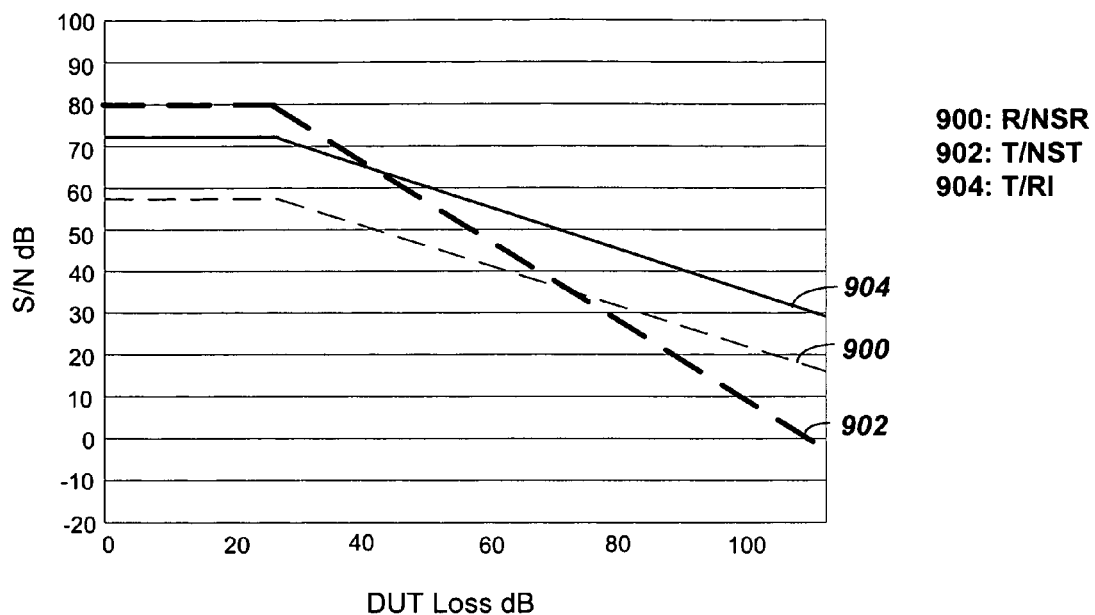
FIG. 9 shows plots of noise signal ratios vs. DUT attenuation as in FIG. 5, with a variable receive channel attenuation A1 as in FIG. 5, as well as a variable test channel attenuation A2 that goes from 26 to 0 when DUT goes from 0 to 26 dB to satisfy a maximum of −21 dBm on the test channel input.

FIG. 9 shows a plot of S/N ratio in dB for three different signals for three different measured signals versus DUT loss in dB with A1 being a variable attenuator that tracks the DUT value only up until DUT=45.4 dB, and A2 changing values above DUT=26 dB. The three signals include a plot 800 of the reference channel signal to noise ratio R/NSR, a plot 802 of the test channel signal to noise ratio T/NST, and a plot 804 of the test channel signal to interfering signal T/RI all versus DUT loss.

Figure 10:
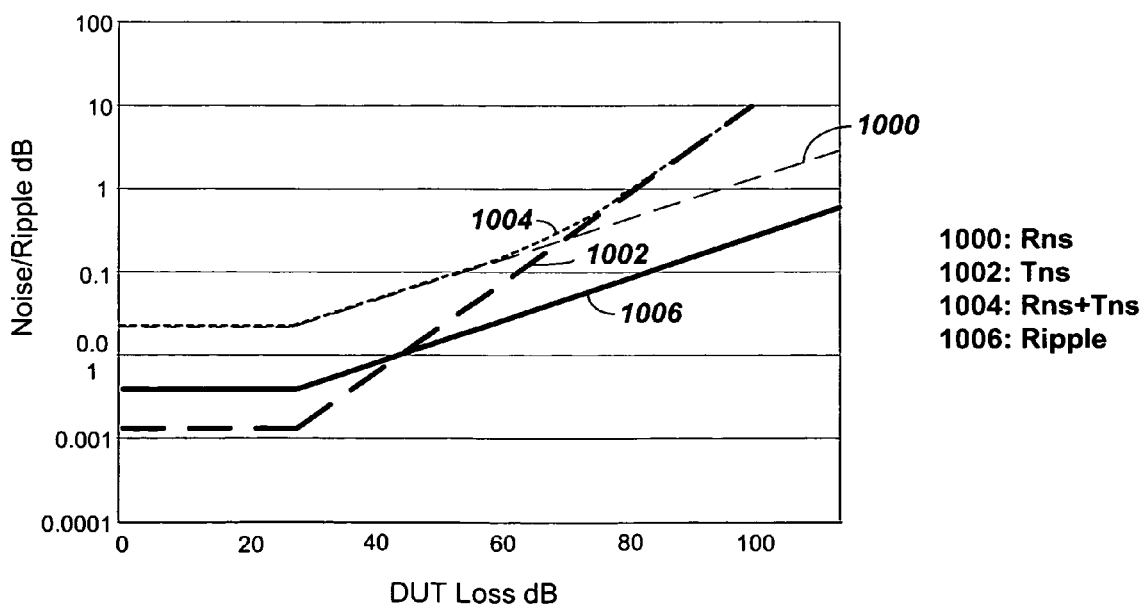
FIG. 10 shows plots of converted noise vs. DUT with the variable attenuation A1 as well as the variable test channel attenuation A2 that goes from 26 to 0 when DUT goes from 0 to 26 dB as in FIG. 9.

FIG. 10 shows a plot of converted noise signals and ripple versus DUT loss in dB from the conditions of FIG. 9. A plot 1000 shows the converted reference channel S/N Rns vs. DUT loss, a plot 1002 shows the converted test channel S/N ratio Tns vs. DUT loss, a plot 1004 shows the converted noise Tns+Rns, and a plot 1006 shows the ripple due to the finite isolation of 50 dB between the R and T samplers.

In FIG. 10, the conditions are changed only slightly from the conditions of FIG. 8. The exception is A2 changing from 26 dB to 0 dB for DUT>45.4 dB. The ripple now stays a constant value (Delta) below the reference channel for all values of DUT. FIG. 10 also shows the extended dynamic range of 26 dB.

4. Fourth Embodiment

In a fourth embodiment, a further reduction in total noise around the crossover where Tns+Rns at DUT=71.4 db can further be realized. The noise reduction is achieved by reverting back to the condition of T/R1+T/NST+Delta for DUT>71.4 dB. This reverts A1 back to a value of 61.4 dB instead of a value based on the DUT, and reverts A2 back from 0 dB to 26 dB with DUT>71.4 dB.

Figure 11:
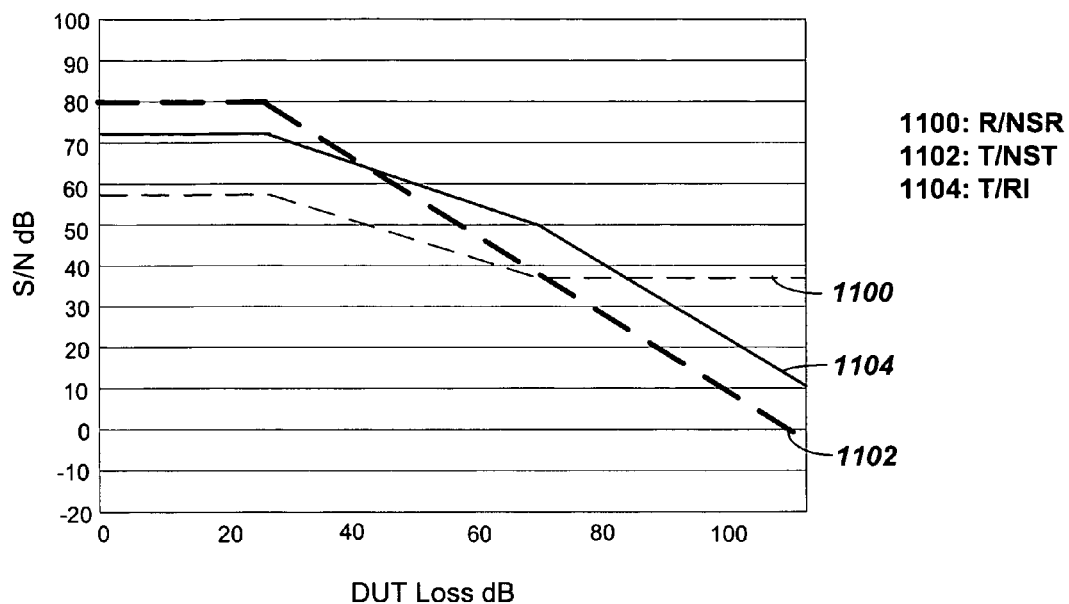
FIG. 11 shows plots of noise signal ratios vs. DUT attenuation as in FIG. 9, with a slight reduction in noise at the crossover where Tns=Rns by reverting A1 back to the constant 61.4 dB with DUT=>71.4 dB.

FIG. 11 shows the effect of this modification with a plot of S/N ratio in dB for three different signals. The three signals include a plot 1100 of the reference channel signal to noise ratio R/NSR, a plot 1102 of the test channel signal to noise ratio T/NST, and a plot 1104 of the test channel signal to interfering signal T/R1 all versus DUT loss.

Figure 12:
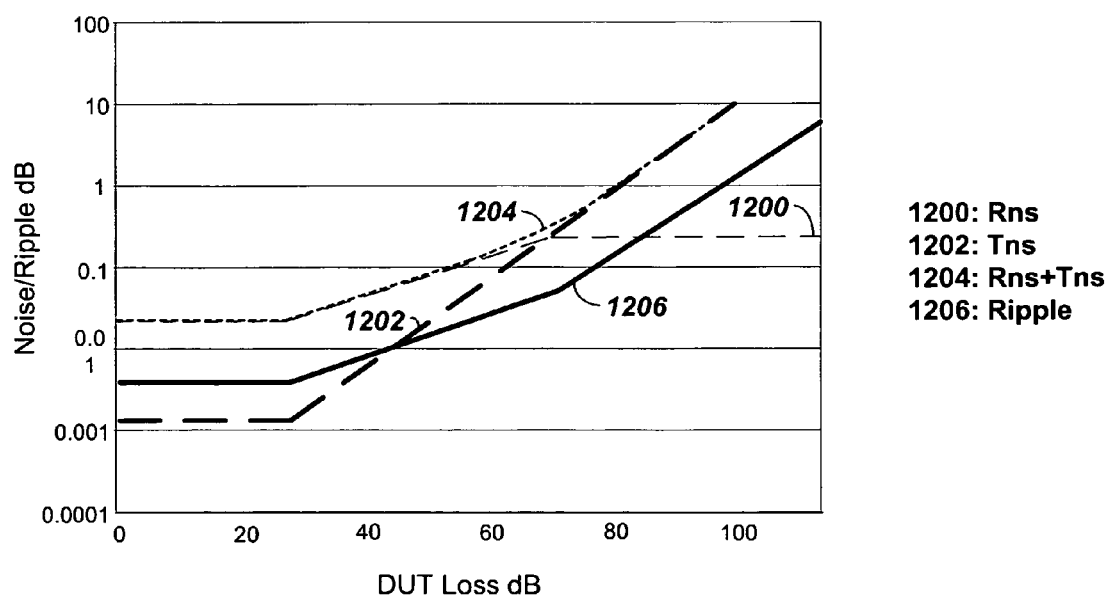
FIG. 12 shows plots of converted noise vs. DUT as in FIG. 11 with the attenuation A1 reverting back to the constant 61.4 dB with DUT=>71.4 dB.

FIG. 12 shows a plot of converted noise signals and ripple versus DUT loss in dB from the conditions of FIG. 11. A plot 1200 shows the converted reference channel S/N Rns vs. DUT loss, a plot 1202 shows the converted test channel S/N ratio Tns vs. DUT loss, a plot 1204 shows the converted noise Tns+Rns, and a plot 1206 shows the ripple due to the finite isolation of 50 dB between the R and T samplers. In FIG. 12, the conditions are changed only slightly from the conditions of FIG. 10. The exception is A2 changing back to 0 dB to 26 dB with DUT>71.4 dB, and A1 changing from a variable based on the DUT to a fixed 61.4 dB.

5. Fifth Embodiment

With embodiments of the present invention described thus far, A1 and A2 have both become variable. Such a variation of A1 and A2 is theoretically viable, but realistically fixed attenuators are desirable. Variable attenuations make the calibration tedious if all combinations of A1 and A2 were used in calibration.

In this fourth embodiment, a limited number of changes for A1 and A2, such as four are used, so only four calibrations will be necessary. The selection of these four values will optimize the total noise while retaining 15 dB (Delta) between Rns for low values of DUT and 15 dB (Delta) between Tns for high values of DUT. The first selection will set the initial DUT value switch point where A2=PIN−IL+21 that satisfies the maximum input of −21 dBm to the T channel down converter. This can be satisfied for DUT=<13. A2 is, thus, determined as follows:

A2=PIN−IL+21        (from Equation 1 for A2 with DUT=0)

A2=+9−4+21

A2=26 for DUT=<13 dB

A1 for this case will use the Equation based on T/R1=R/NSR+Delta stated in the first embodiment.

A1=PIN/2−CPL+(IL+DUT+A2+Delta−ISO−NSR)/2        (From Equation 2 for A1)

The value of DUT will be at A2/2 so that the next selection point can be at DUT−A2 for A2=0.

A1=9/2−14+(4+13+26+15−50−(−101.4)/2

A1=45.2 For DUT=<13

Then next break point will occur at DUT=13 where A2 can be reduced to 13 and still not violate the −21 dBm input to the T Channel Down Converter.

A2=PIN−IL−DUT+21

A2=+9−4−13+21

A2=13 for DUT>13 to =26

The next break point will occur at DUT=26 where A2 can reduce to 0 and still not violate the −21 dBm input to the T Channel Down Converter.

A2=PIN−IL−DUT+21        (From Equation 1 for A2)

A2=9/2−14+(4+39+0+15−50−(−101.4)/2

A1=45.2 For DUT>26 to =<39

Next, the Equations for A1 and A2 revert back to being based on T/RI=T/NST+Delta described in the background of this application.

A2=PIN−IL−DUT+21        (From Equation 1 for A2)

A2=+9−4−26+21

A2=0 For DUT>39

A1=PIN−CPL−NST−ISO+Delta        (From Equation 1 for A1)

A1=9−14−(−101.4)−50+15

A1=61.4 For DUT>39

Figure 13:
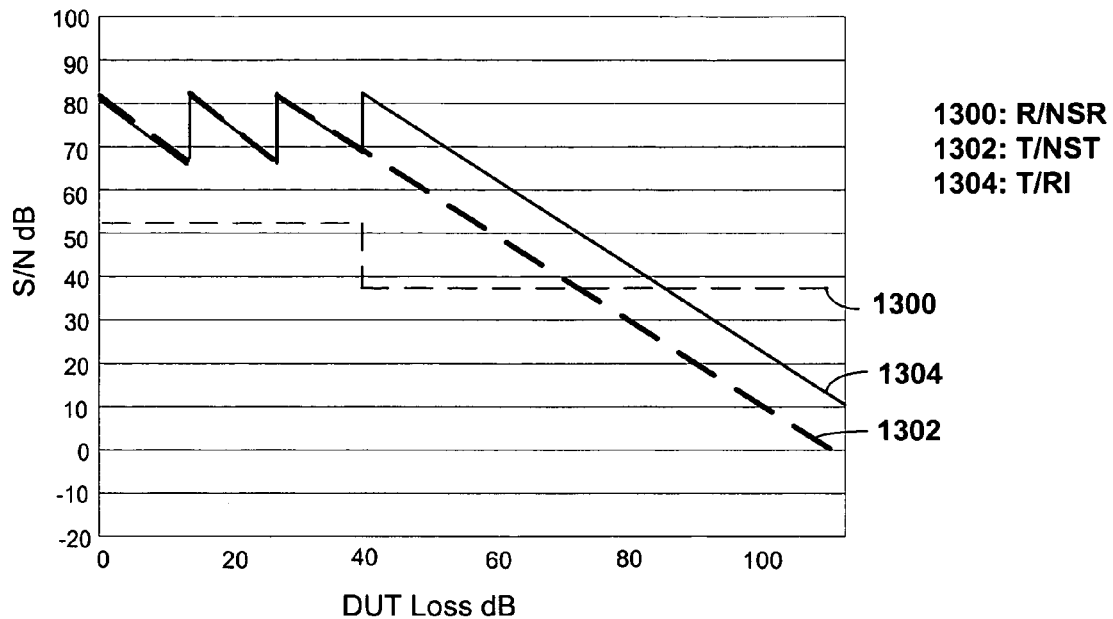
FIG. 13 shows plots of noise signal ratios vs. DUT attenuation with the attenuation of A1 and A2 varied through four sets of values, with A2=26 for a DUT of 0-13 dB, A2=13 for a DUT of 13-26 dB, A2=0 for a DUT>26 dB, and A1=45.2 for a DUT of 0 to 39 dB and A=61.4 for DUT>39 dB.

FIG. 13 shows the effect of varying A1 and A2 over four steps for three different signals for this fifth embodiment. The three signals include a plot 1300 of the reference channel signal to noise ratio R/NSR, a plot 1302 of the test channel signal to noise ratio T/NST, and a plot 1304 of the test channel signal to interfering signal T/R1 all versus DUT loss.

Figure 1:
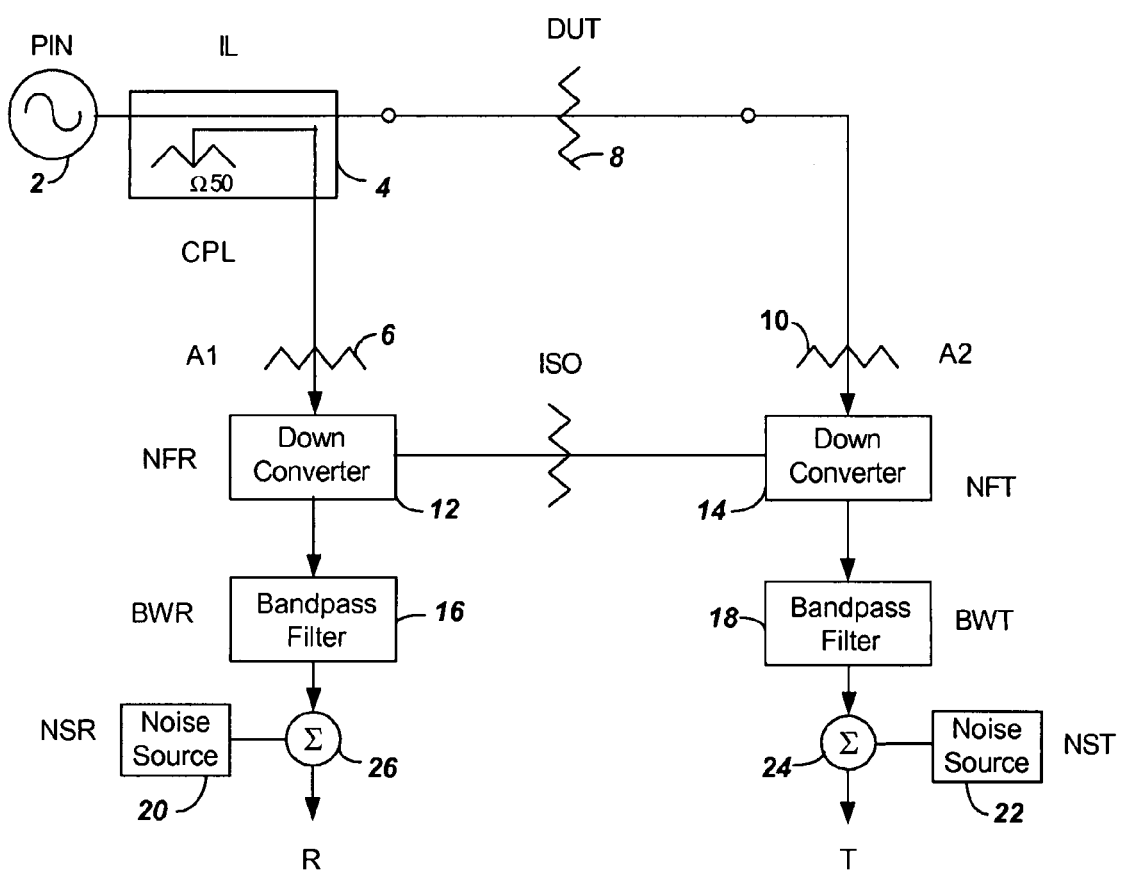
FIG. 1 shows typical components of a VNA connected to measure a DUT.
Figure 2:
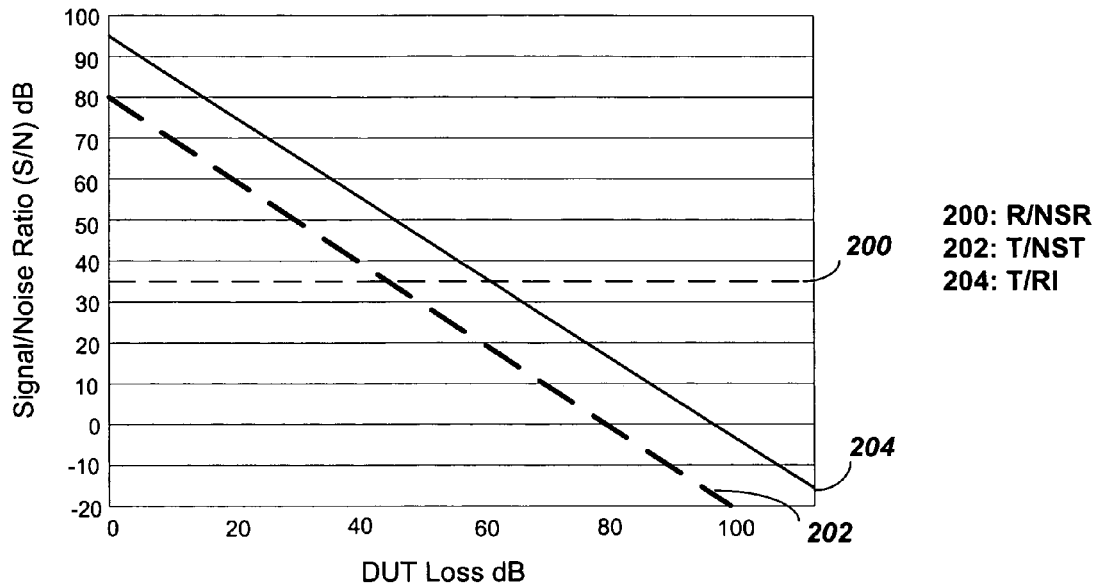
FIG. 2 shows plots of noise signal ratios vs. DUT attenuation, the noise signals ratios including: (a) R/NST—the receive channel signal to noise ratio, (b) T/NST—the test channel signal to noise ratio, and (c) T/RI the test channel signal to interfering signal test signal ratio.
Figure 3:
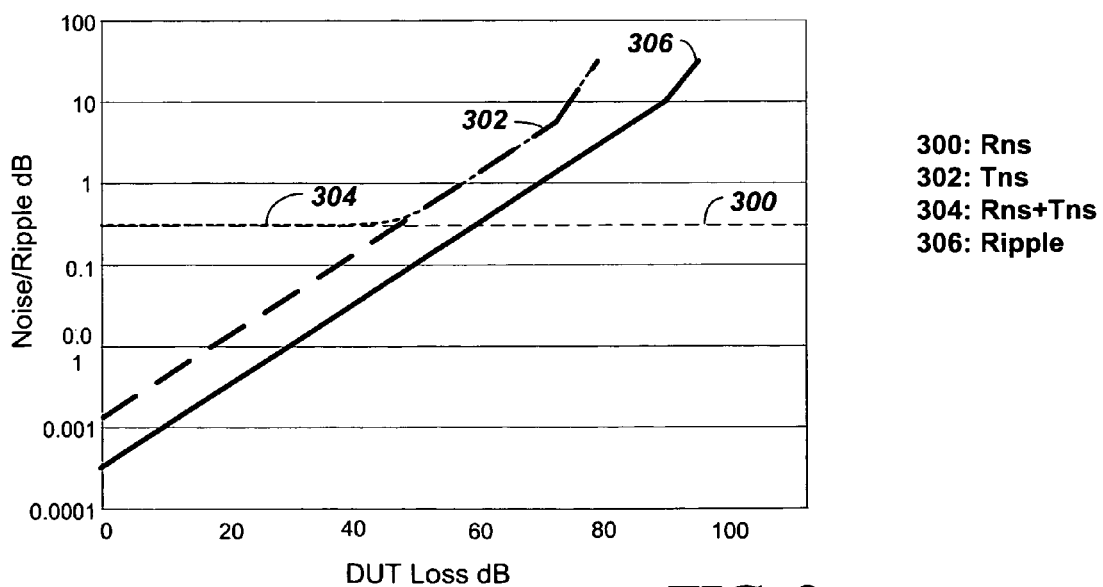
FIG. 3 shows plots of converted noise vs. DUT attenuation, the converted noise including: (a) Rns—the receive channel noise, (b) Tns—the test channel noise, (c) Rns+Tns—the total receive channel and test channel noise, and (d) the ripple due to the finite isolation of 50 dB between the R and T samplers.
Figure 14:
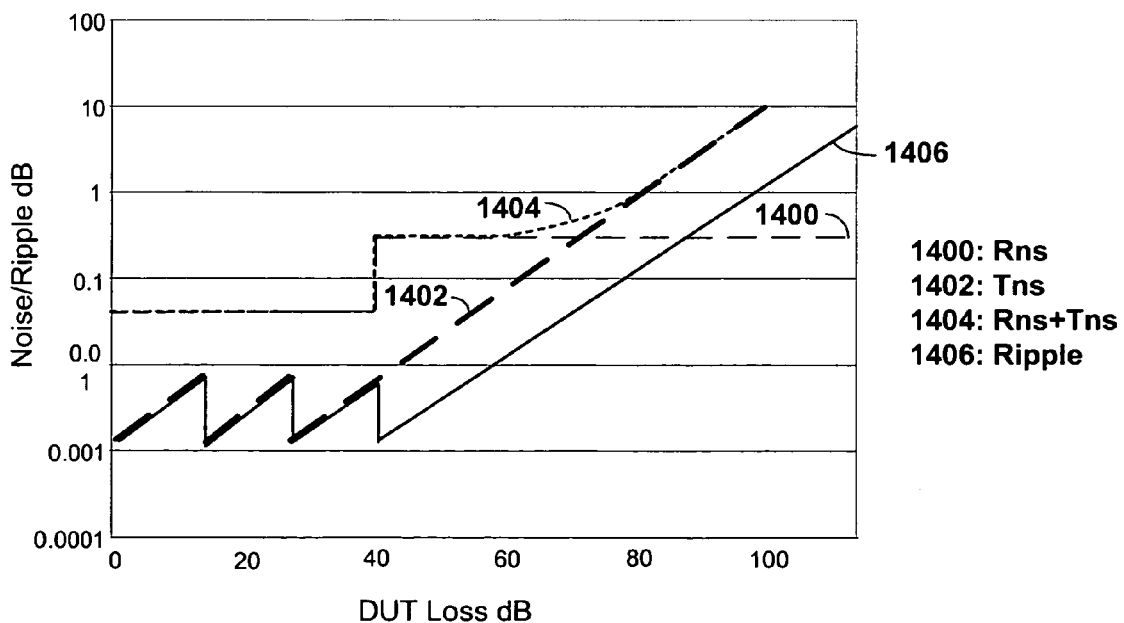
FIG. 14 shows plots of converted noise vs. DUT for the values of A1 and A2 of FIG. 13.

FIG. 14 shows a plot of converted noise signals and ripple versus DUT loss in dB from the conditions of FIG. 13. A plot 1200 shows the converted reference channel S/N Rns vs. DUT loss, a plot 1402 shows the converted test channel S/N ratio Tns vs. DUT loss, a plot 1404 shows the converted noise Tns+Rns, and a plot 1406 shows the ripple due to the finite isolation of 50 dB between the R and T samplers. In FIG. 14, the conditions are changed only slightly from the conditions shown in FIGS. 2-3. The exception is A1 and A2 changing from a fixed 61.4 dB and 26 dB respectively for this fifth embodiment.

6. Sixth Embodiment

In a sixth embodiment, a compromise is made if only 2 sets of values are used for A1 and A2. The first set of values will be used from DUT<26 or the value needed to keep the T channel Down Converter from having an input >−21 dBm for DUT=0. This is determined by the Equation A2=PIN−IL−DUT−T from Equation 1 for A2 where DUT=0 and T=21 dBm. The equation A1=PIN/2−CPL+(IL+DUT+A2+Delta−ISO−NSR)/2 from Equation 2 for A1 for DUT<26. The second set of values for A2 will again be determined by the equation A2=PIN−IL−DUT−T where DUT=26 and T=21 dBm. The second set of values for A1 will be determined from A1=PIN−CPL−NST−ISO+Delta from Equation 1 for A1.

A2=PIN−IL−DUT−T     (From Equation 1 for A2)

A2=+9−4−0(−21)

A2=26 For DUT<26

A1=PIN/2−CPL+(IL+DUT+A2+Delta−
   ISO−NSR)/2     (From Equation 2 for A2)

A1=9/2−14+(4+26+26+15+50−(−101.4))/2

A1=51.7 For DUT=<26

A2=PIN−IL−DUT−T     (From Equation 1 for A2)

A2=+9−4−26−(−21)

A2=0 For DUT>26

A1=PIN−CPL−NST−ISO+Delta     (From Equation 1 for A1)

A1=9−14−(−101.4)−50+15

A1=61.4 For DUT>26

Figure 15:
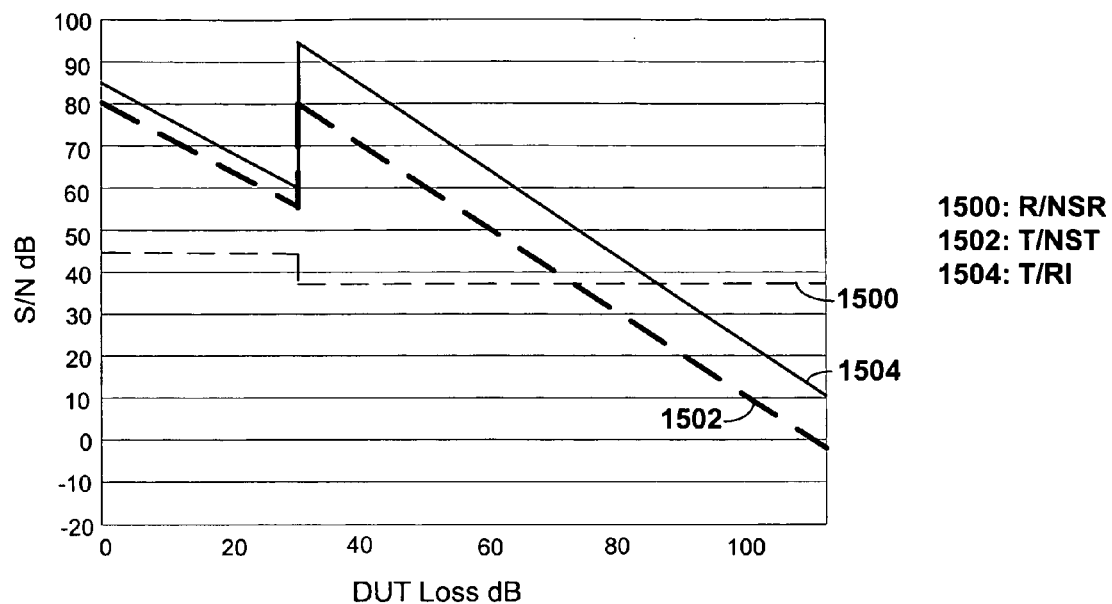
FIG. 15 shows plots of noise signal ratios vs. DUT attenuation with the attenuation of A1 and A2 varied through two sets of values, with A2=26 for a DUT of 0-26 dB, A2=0 for a DUT>26 dB, and A1=51.7 for a DUT of 0 to 26 dB and A=61.4 for DUT>26 dB.

FIG. 15 shows the effect of varying A1 and A2 over two steps in this embodiment. The three signals include a plot 1500 of the reference channel signal to noise ratio R/NSR, a plot 1302 of the test channel signal to noise ratio T/NST, and a plot 1304 of the test channel signal to interfering signal T/RI all versus DUT loss.

Figure 16:
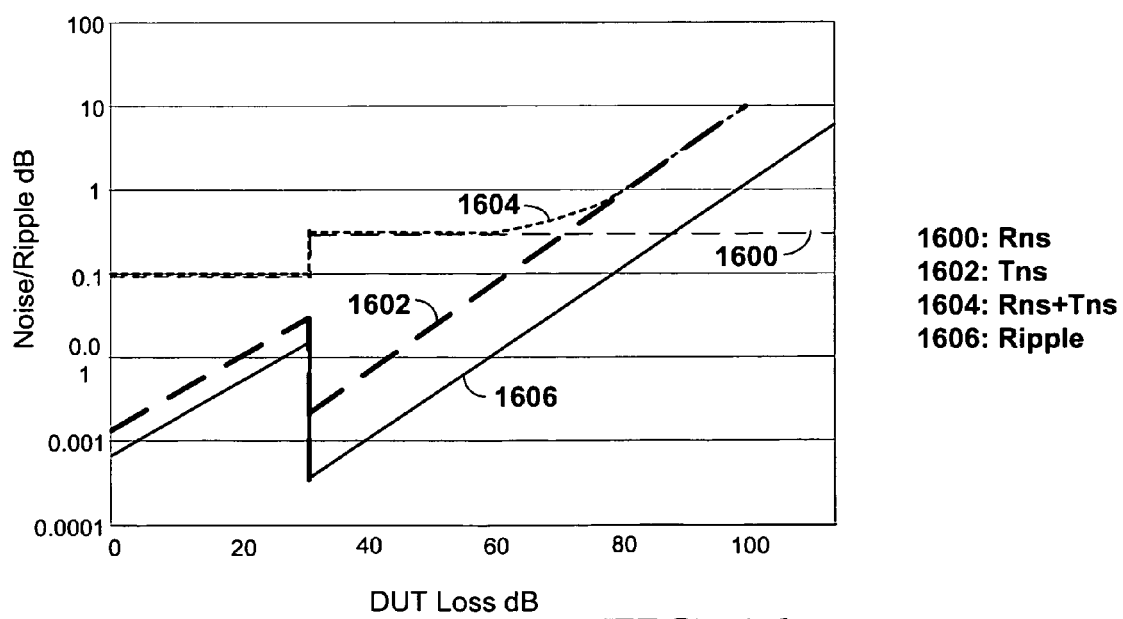
FIG. 16 shows plots of converted noise vs. DUT for the values of A1 and A2 of FIG. 16.

FIG. 16 shows a plot of converted noise signals and ripple versus DUT loss in dB from the conditions of FIG. 15. A plot 1600 shows the converted reference channel S/N Rns vs. DUT loss, a plot 1602 shows the converted test channel S/N ratio Tns vs. DUT loss, a plot 1204 shows the converted noise Tns+Rns, and a plot 1606 shows the ripple due to the finite isolation of 50 dB between the R and T samplers. In FIG. 16, the conditions are changed only slightly from the conditions shown in FIGS. 2-3. The exception is A1 and A2 changing from a fixed 61.4 dB and 26 dB respectively to the values for this sixth embodiment.

Figure 17:
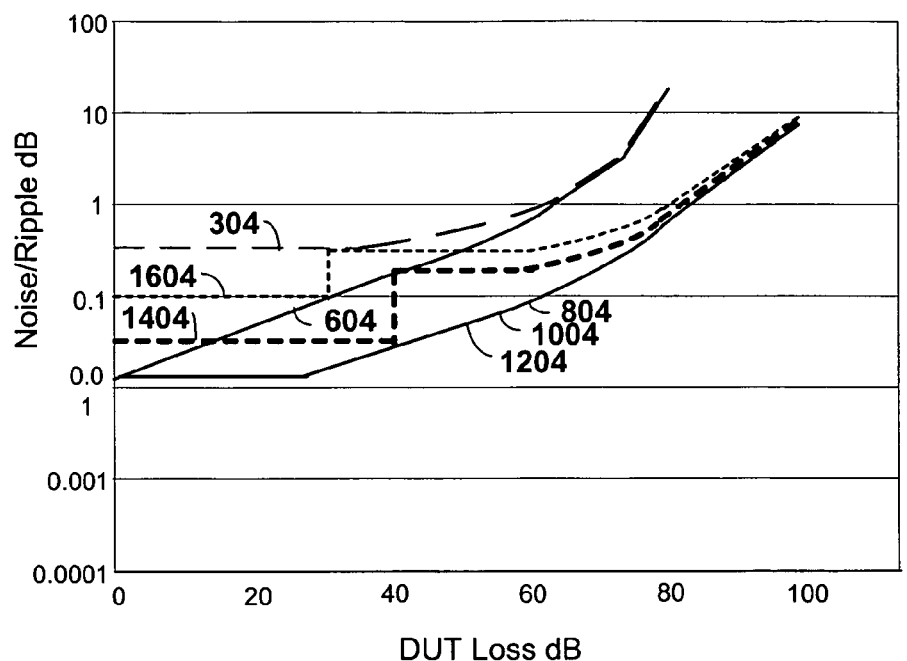
FIG. 17 shows a comparison of the plots for total noise Tns+Rns for each of the FIGS. 3, 6, 8, 10, 12, 14 and 16.

FIG. 17 shows a comparison of the plots for total noise Tns+Rns for each of the FIGS. 3, 6, 8, 10, 12, 14 and 16. The labels for the plots for Tns+Rns in FIG. 17 remain the same from their previous respective figures.

Although the present invention has been described above with particularity, this was merely to teach one of ordinary skill in the art how to make and use the invention. Many additional modifications will fall within the scope of the invention, as that scope is defined by the following claims.

What is claimed:

1. A test device for measuring insertion loss and gain of a device under test (DUT) comprising:
a reference channel receiver for receiving a reference signal (R) provided from a signal source (PIN) to the device under test;
a test channel receiver for receiving the test signal (T) provided from the signal source (PIN) through the device under test; and
a reference path attenuation device having a selectable attenuation (A1) provided in a path of the reference signal to the reference channel receiver, wherein the selectable attenuation (A1) is automatically adjusted in the test device to track the attenuation of the connected DUT.

2. The test device of claim 1, wherein the reference path attenuation device attenuation (A1) provides a predetermined number of attenuation steps that are selected dependant on the attenuation of the connected DUT.

3. The test device of claim 1, further comprising:
a test path selectable attenuation device having a selectable attenuation (A2) provided in a path of the test signal to the test channel receiver.

4. A device for measuring insertion loss and gain of a device under test comprising:
a reference channel receiver for receiving a reference signal (R) provided from a signal source (PIN) to the device under test;
a test channel receiver for receiving the test signal (T) provided from the signal source (PIN) through the device under test;
a reference path attenuation device having a selectable attenuation (A1) provided in a path of the reference signal to the reference channel receiver;
a test path selectable attenuation device having a selectable attenuation (A2) provided in a path of the test signal to the test channel receiver;
a coupler having a through path with insertion loss (IL) connecting the signal source (PIN) to the device under test, and having a coupling path with coupling loss (CPL) connecting the signal source (PIN) to the reference path attenuation device;
a reference signal down converter provided in a reference signal path between reference path attenuation device and the reference channel receiver; and
a test signal down converter provided in a test signal path between the test path selectable attenuation device and the test channel down converter, wherein an isolation value (ISO) is provided between the reference signal down converter and the test signal down converter.

5. The device of claim 4, wherein the reference signal attenuator selectable attenuation value (A1) is varied to allow T/RI=R/NSR+Delta, wherein:
RI is an isolation noise signal received by the test signal down converter less the isolation value ISO (R−IS0);
NSR is noise of the reference channel receiver;
NST is noise of the test channel receiver; and
Delta is an amount T/RI is greater than T/NST.

6. The device of claim 5,
wherein the selectable attenuation device provides an attenuation A1,
wherein A1=PIN/2−CPL+(IL+DUT+A2+Delta−ISO−NSR)/2, and
wherein the selectable attenuation A2=PIN−IL−DUT−T.

7. The device of claim 4 wherein a reference channel receiver noise NSR is greater than a receiver ripple noise RIP(R/NSR) by a value Delta, wherein:
RI is an isolation noise signal received by the test signal down converter less the isolation value ISO (R−IS0);
NSR is noise of the reference channel receiver;
NST is noise of the test channel receiver;
Delta is an amount T/RI is greater than T/NST; and $$RIP(R/NSR)=20*(\text{Log}(1+10^{((R/NSR)/20)})-\text{Log}(1-10^{((R/NSR)/20)})).$$

8. The device of claim 5, wherein the selectable attenuation value (A1) is varied to allow T/R1=R/NSR+Delta for the DUT values up to a predetermined value, and to a constant for values for DUT values higher than the predetermined value.

9. The device of claim 8, wherein the selectable attenuation value (A1) is varied to allow T/R1=R/NSR+Delta for the DUT values approximately up to where Tns=Rn and the value A1 is set to allow T/R1=T/NST+Delta for higher ones of the DUT values, wherein $$Tns=20*(Log(1+10^{((T/NST)/20)})-Log(1-10^{((T/NST)/20)});$$
and $$Rns=20*(Log(1+10^{((R/NSR)/20)})-Log(1-10^{((R/NSR)/20)}).$$

10. The device of claim 8, wherein the predetermined value is a DUT value of approximately 45.4 dB, and wherein the constant is 61.4 dB.

11. The device of claim 8, wherein the predetermined value is a DUT value of approximately 71.4 dB, and wherein the constant is 71.4 dB.

12. The device of claim 4, wherein the selectable attenuation value A2 is set so that A2=PIN−IL−DUT−T for DUT values ranging from 0 to PIN−IL−T and wherein A2=0 for DUT values greater than PIN−IL−T.

13. The device of claim 12, wherein a maximum input of T is approximately −21 dBm and wherein PIN−IL−T is approximately 26 dB.

14. The device of claim 12, wherein the selectable attenuation value (A1) is varied to allow T/R1=R/NSR+Delta for the DUT values up to a predetermined value, and to a constant for values for DUT values higher than the predetermined value, wherein
RI is an isolation noise signal received by the test signal down converter less the isolation value ISO (R−IS0);
NSR is noise of the reference channel receiver;
NST is noise of the test channel receiver; and
Delta is an amount T/RI is greater than T/NST.

15. The device of claim 14, wherein the selectable attenuation value A1 is varied to allow T/R1=R/NSR+Delta for the DUT values approximately up to where Tns=Rns and the value A1 is set to allow T/R1=T/NST+Delta for higher ones of the DUT values, wherein $$Tns=20*(Log(1+10^{((T/NST)/20)})-Log(1-10^{((T/NST)/20)});$$
and $$Rns=20*(Log(1+10^{((R/NSR)/20)})-Log(1-10^{((R/NSR)/20)}).$$

16. A device for measuring insertion loss and gain of a device under test comprising:
a reference channel receiver for receiving a reference signal (R) provided from a signal source (PIN) to the device under test;
a test channel receiver for receiving the test signal (T) provided from the signal source (PIN) through the device under test; and
a reference path attenuation device having a selectable attenuation (A1) provided in a path of the reference signal to the reference channel receiver,
wherein the reference path attenuation device attenuation (A1) is varied defendant on attenuation of the device under test (DUT) and wherein the selectable attenuation A1=DUT/2 plus a constant.

17. A device for measuring insertion loss and gain of a device under test comprising:
a reference channel receiver for receiving a reference signal (R) provided from a signal source (PIN) to the device under test;
a test channel receiver for receiving the test signal (T) provided from the signal source (PIN) through the device under test; and
a reference path attenuation device having a selectable attenuation (A1) provided in a path of the reference signal to the reference channel receiver; and
a test path selectable attenuation device having a selectable attenuation (A2) provided in a path of the test signal to the test channel receiver;
wherein the selectable attenuation value A1 and the selectable attenuation value A2 are switched between a given number of values as the DUT attenuation varies.

18. The device of claim 17, wherein transitions of A2 and A1 are made in steps,
wherein A2 is less than or equal to PIN−IL−DUT−T for DUT values ranging from 0 to PIN−IL−T, and A2=0 for higher values of DUT, and
wherein A1 will be determined from T/RI=R/NSR+Delta for first values of DUT up to DUT=PIN−IL+T, and A1 will be determined from T/RI=T/NST+Delta with greater than DUT=PIN−IL+T.

19. The device of claim 18, wherein the transitions of A2 and A1 are made in four of the steps between values of the DUT,
wherein A2 is approximately 26 dB for DUT values less than 13 dB,
wherein A2 is approximately 13 dB for DUT values between 13 dB and 26 dB,
wherein A2 is approximately 0 dB for DUT values greater than 26 dB,
wherein A1 is approximately 45.2 dB for DUT values less than 39 dB, and
wherein A1 is approximately 61.4 dB for DUT values greater than 39 dB.

20. The device of claim 18, wherein the transitions of A2 and A1 are made in two of the steps between values of the DUT,
wherein A2 is approximately 26 dB for DUT values less than 26 dB,
wherein A1=51.7 dB for the DUT value less than 26 dB,
wherein A2 is approximately 0 for DUT values greater than 26 dB, and
wherein A1 is approximately 61.4 for the DUT values greater than 26 dB.

21. A device for measuring insertion loss and gain of a device under test (DUT) comprising:
a reference signal receiver for receiving the reference signal (R) provided from a signal source (PIN) to the DUT;
a test signal receiver for receiving the test signal (T) provided from the signal source (PIN) through the DUT; and
a reference path attenuation device having an attenuation (A1) provided in a Path of the reference signal to the reference channel receiver;
a test path selectable attenuation device provided in a path of the reference signal to the test signal receiver, the test path selectable attenuation device having a selectable attenuation (A2) provided in a path of the test signal to the test channel receiver;
a coupler having a through path with insertion loss (IL) connecting the signal source (PIN) to the device under test, and having a coupling path with coupling loss (CPL) connecting the signal source (PIN) to the reference path attenuation device;
a reference signal down converter provided in a reference signal path between reference path attenuation device and the reference channel receiver; and a test signal down converter provided in a test signal path between the test path selectable attenuation device and the test channel down converter, wherein an isolation value (ISO) is provided between the reference signal down converter and the test signal down converter, wherein the selectable attenuation value A2 is set so that A2=PIN−IL−DUT−T for DUT values ranging from 0 to PIN−IL−T and wherein A2=0 for DUT values greater than PIN−IL−T.

22. The device of claim 21, wherein a maximum input of T is approximately −21 dBm and wherein PIN−IL−T is approximately 26 dB.

* * * * *